(12) United States Patent
Shon

(10) Patent No.: US 9,531,365 B1
(45) Date of Patent: Dec. 27, 2016

(54) SIGNAL GENERATOR ADJUSTING A DUTY CYCLE AND SEMICONDUCTOR APPARATUS USING THE SAME

(71) Applicant: SK hynix Inc., Icheon-si Gyeonggi-do (KR)

(72) Inventor: Kwan Su Shon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/969,326

(22) Filed: Dec. 15, 2015

(30) Foreign Application Priority Data

Jul. 17, 2015 (KR) .......................... 10-2015-0101788

(51) Int. Cl.
*H03K 3/017* (2006.01)
*H03K 5/156* (2006.01)
*H03K 5/003* (2006.01)
*H03K 19/0185* (2006.01)

(52) U.S. Cl.
CPC ............ *H03K 5/1565* (2013.01); *H03K 5/003* (2013.01); *H03K 19/018507* (2013.01)

(58) Field of Classification Search
USPC .................................. 327/108, 112, 172–175
See application file for complete search history.

(56) References Cited

U.S. PATENT DOCUMENTS 9,024,558 B2 * 5/2015 Sugie ..................... H03K 3/012
318/400.26

FOREIGN PATENT DOCUMENTS

KR              100604809 B1       7/2006

* cited by examiner

*Primary Examiner* — An Luu
(74) *Attorney, Agent, or Firm* — William Park & Associates Ltd.

(57) ABSTRACT

A semiconductor apparatus may include a signal generator, and may operate by receiving two or more external power voltages. The signal generator may include a duty cycle circuit. The duty cycle circuit may include a duty control circuit and a duty cycle adjustment circuit. The duty cycle adjustment circuit may be configured to compensate a duty change of an output signal when a power voltage domain changes.

29 Claims, 6 Drawing Sheets

FIG.2
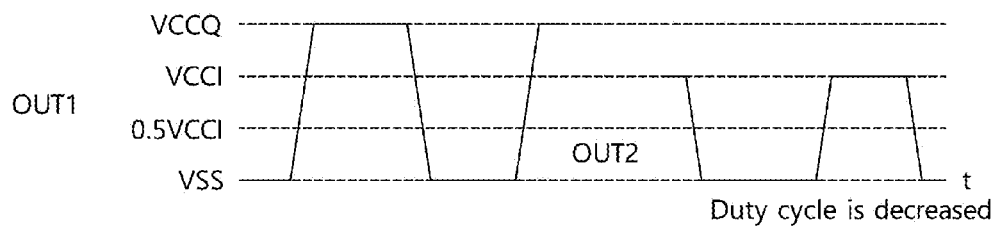
Duty cycle is decreased
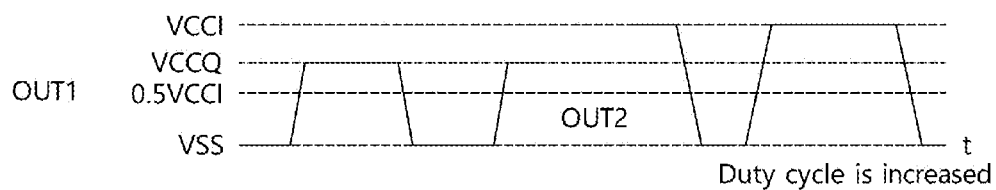
Duty cycle is increased
FIG.3
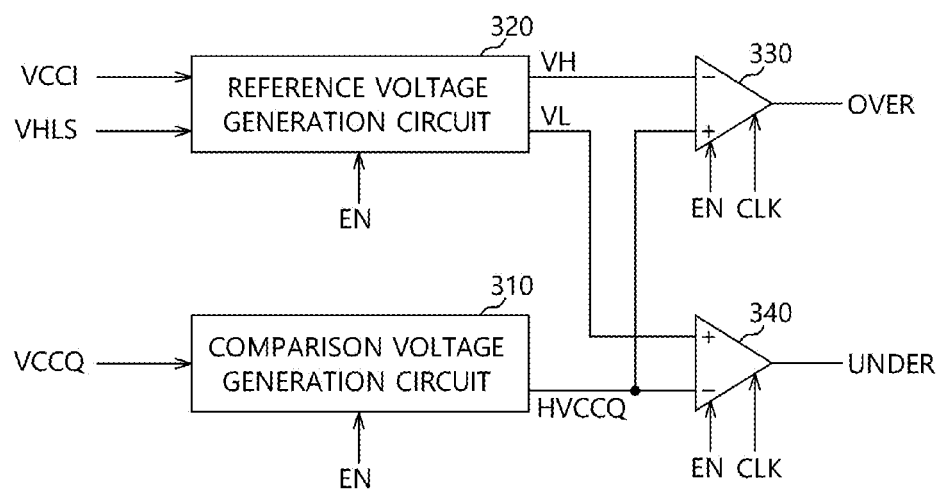

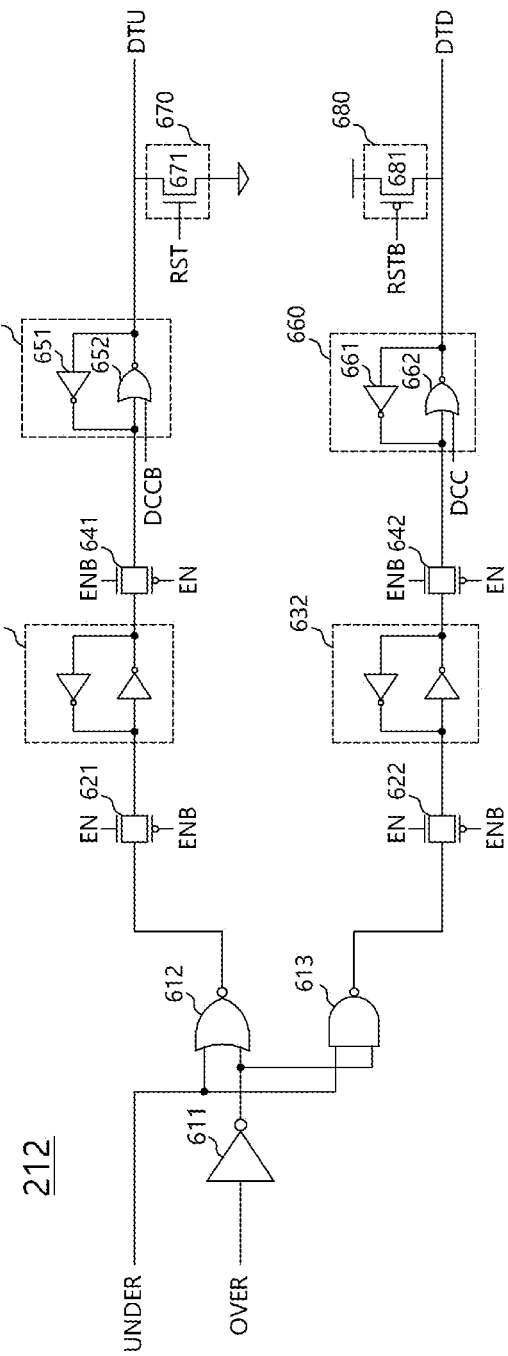

US 9,531,365 B1

SIGNAL GENERATOR ADJUSTING A DUTY CYCLE AND SEMICONDUCTOR APPARATUS USING THE SAME

CROSS-REFERENCES TO RELATED APPLICATION

The present application claims priority under 35 U.S.C. §119(a) to Korean application number 10-2015-0101788, filed on Jul. 17, 2015 in the Korean Intellectual Property Office, which is incorporated herein by reference in its entirety as set forth.

BACKGROUND

1. Technical Field

Various embodiments generally relate to a semiconductor apparatus, and more particularly, to a signal generator capable of adjusting a duty cycle and a semiconductor apparatus using the same.

2. Related Art

In general, a semiconductor apparatus includes various internal logic circuits, and the internal logic circuits perform an operation by receiving power provided from an external apparatus. The internal logic circuits include a logic circuit directly related to data input and output, and a logic circuit indirectly related to data input and output. As a number of internal logic circuits concurrently performing operations increases, a noise in a power voltage becomes greater. Since data has a predetermined valid window or duration, the semiconductor apparatus is very vulnerable to the noise in the power voltage as operation speeds of the semiconductor apparatus becomes greater.

In order to handle such a problem, the semiconductor apparatus separately receives a power voltage for the logic circuit directly related to data input and output, and a power voltage for the other circuits. Accordingly, various semiconductor apparatuses receive two or more power voltages from the external apparatus.

BRIEF DESCRIPTION OF THE DRAWINGS

FIG. 2 is a timing diagram illustrating representations of examples of waveforms of output signals according to level difference between power voltages.

FIG. 3 is a block diagram illustrating a representation of an example of a power voltage detection circuit illustrated in FIG. 1.

FIG. 6 is a circuit diagram illustrating a representation of an example of a duty control signal generation circuit illustrated in FIG. 1.

FIG. 7 is a table illustrating a representation of an example of an operation of a semiconductor apparatus in accordance with an embodiment.

DETAILED DESCRIPTION

Various embodiments may be provided for a signal generator capable of compensating for distortion of a duty cycle when a power voltage domain changes, and a semiconductor apparatus using the same.

In an embodiment, a signal generator may be provided. The signal generator may include a first buffer configured to amplify an input signal to a level of a first power voltage and generate a first output signal. The signal generator may include a second buffer configured to amplify the first output signal to a level of a second power voltage and generate a second output signal. The signal generator may include a duty control circuit configured to generate a duty control signal by comparing the levels of the first power voltage and the second power voltage. The signal generator may include a duty cycle adjustment circuit configured to change a voltage level of the first output signal based on the input signal and the duty control signal.

In an embodiment, a semiconductor apparatus may be provided. The semiconductor apparatus may include a first buffer configured to generate a first output signal having a voltage level between a first power voltage and a first ground voltage to amplify an input signal. The semiconductor apparatus may include a second buffer configured to generate a second output signal having a voltage level between a second power voltage and a second ground voltage to amplify the first output signal. The semiconductor apparatus may include a duty cycle circuit configured to pull-up drive the first output signal when the level of the first power voltage is higher than the level of the second power voltage, and pull-down drive the first output signal when the level of the first power voltage is lower than the level of the second power voltage.

In an embodiment, a signal generator may be provided. The signal generator may include a first buffer configured to amplify an input signal to a level of a first power voltage and generate a first output signal. The signal generator may include a second buffer configured to amplify the first output signal to a level of a second power voltage and generate a second output signal. The signal generator may include a duty cycle circuit configured to compensate for a change of a duty of the second output signal according to level differences between the first power voltage and the second power voltage.

Hereinafter, a semiconductor apparatus will be described below with reference to the accompanying drawings through various embodiments.

Figure 1:
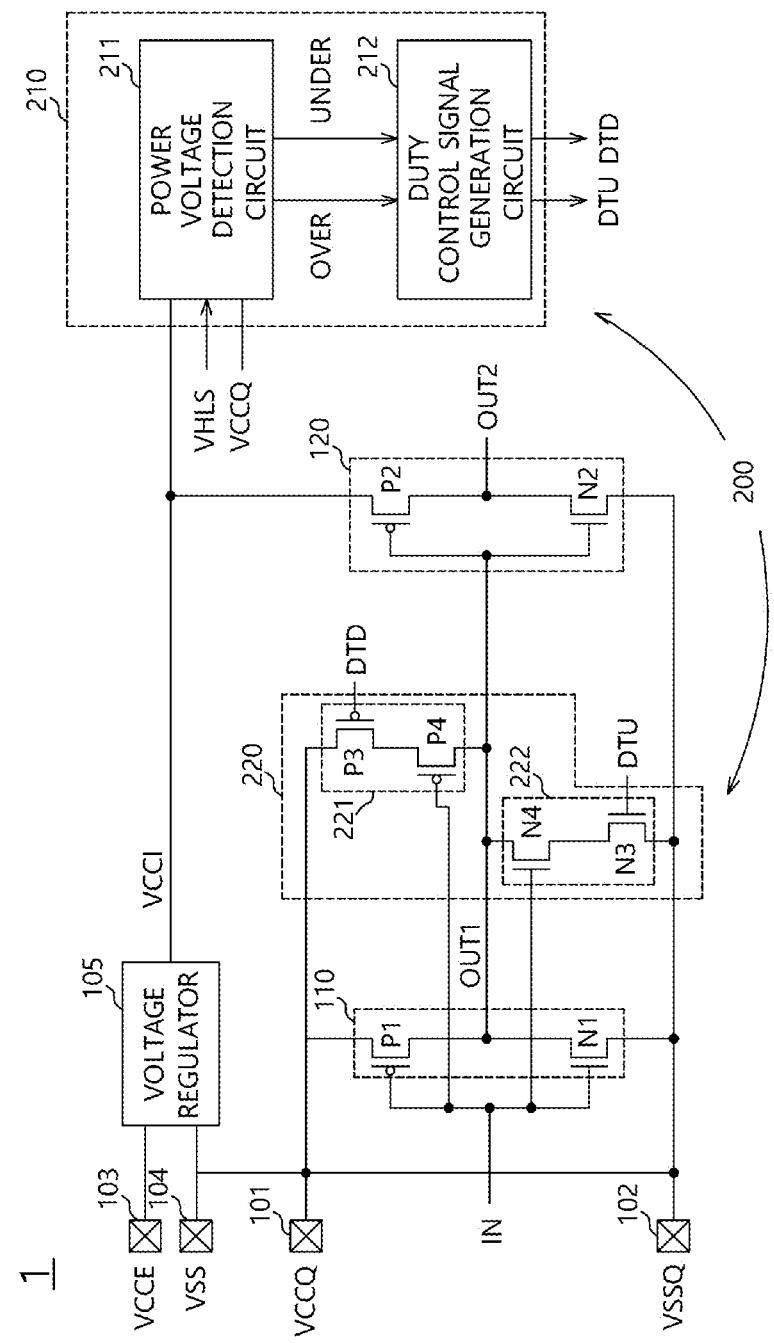
FIG. 1 is a circuit diagram illustrating a representation of an example of a semiconductor apparatus in accordance with an embodiment.

FIG. 1 is a circuit diagram illustrating a semiconductor apparatus 1 in accordance with an embodiment. Referring to FIG. 1, the semiconductor apparatus 1 may perform operations by receiving two different external power voltages and two ground voltages. The semiconductor apparatus 1 may include first to fourth voltage pads 101, 102, 103, and 104. The semiconductor apparatus 1 may receive a first external power voltage VCCQ through the first voltage pad 101. The semiconductor apparatus 1 may receive a first ground voltage VSSQ through the second voltage pad 102. The semiconductor apparatus 1 may receive a second external power voltage VCCE through the third voltage pad 103. The semiconductor apparatus 1 may receive a second ground voltage VSS through the fourth voltage pad 104.

The semiconductor apparatus 1 may use the first external power voltage VCCQ provided through the first voltage pad 101 as a first power voltage. In the description, a single reference "VCCQ" will be used for both of the first external power voltage and the first power voltage. The semiconductor apparatus 1 may use a voltage, which is generated through regulating of the second external power voltage VCCE provided through the third voltage pad 103, as a second power voltage VCCI. The semiconductor apparatus 1 may include a voltage regulator 105 suitable for generating the second power voltage VCCI by regulating the second external power voltage VCCE. The voltage regulator 105 may be a low drop-out regulator (LDO) or a DC-DC converter.

The first ground voltage VSSQ and the second ground voltage VSS may have the same voltage level. The second voltage pad 102 and the fourth voltage pad 104 may be electrically coupled to each other or be electrically isolated from each other. The first ground voltage VSSQ and the second ground voltage VSS may be shared by each other and used as a power of the semiconductor apparatus 1. As an example, the second and fourth voltage pads 102 and 104 may be combined to a single voltage pad, through which the semiconductor apparatus 1 receives a single ground voltage.

The first power voltage VCCQ and the second power voltage VCCI may have the same voltage level. The first voltage pad 101 and the third voltage pad 103 may be electrically isolated from each other. The first power voltage VCCQ provided through the first voltage pad 101 may be used for receiving of an input signal provided from an external apparatus. Also, the first power voltage VCCQ may be used for outputting an internal signal of the semiconductor apparatus 1 to the external apparatus. The second power voltage VCCI, which is generated on the basis of the second external power voltage VCCE provided through the third voltage pad 103, may be used by internal circuits of the semiconductor apparatus 1. A group of circuits using the first power voltage VCCQ and a group of circuits using the second power voltage VCCI may be different from each other.

The semiconductor apparatus 1 may include a signal generator. The signal generator may include a first buffer 110, a second buffer 120, and a duty cycle circuit 200. The first buffer 110 may receive an input signal IN, and generate a first output signal OUT1 by amplifying the input signal IN to the level of the first power voltage VCCQ. The first buffer 110 may use the first power voltage VCCQ as a power therefor. The first buffer 110 may generate the first output signal OUT1 swinging between the levels of the first power voltage VCCQ and the first ground voltage VSSQ by amplifying the input signal IN.

The second buffer 120 may receive the first output signal OUT1, and generate a second output signal OUT2 by amplifying the first output signal OUT1 to the level of the second power voltage VCCI. The second buffer 120 may use the second power voltage VCCI as a power therefor. The second buffer 120 may generate the second output signal OUT2 swinging between the levels of the second power voltage VCCI and the second ground voltage VSS by amplifying the first output signal OUT1. The first buffer 110 may use the first power voltage VCCQ as the power therefor while the second buffer 120 may use the second power voltage VCCI as the power therefor, and thus the first and second buffers 110 and 120 may be a region, in which a power voltage domain changes. Each of the first and second buffers 110 and 120 may have an inverter structure, which will not limit scope of the present disclosure. Each of the first and second buffers 110 and 120 may have an inverter circuit, which will not limit scope of the present disclosure.

The first buffer 110 may include a first PMOS transistor P1 and a first NMOS transistor N1. The first PMOS transistor P1 may receive the input signal IN through its gate, and the first power voltage VCCQ through its source. The first NMOS transistor N1 may receive the input signal IN through its gate, may be electrically coupled to the first ground voltage VSSQ through its source, and may be electrically coupled to a drain of the first PMOS transistor P1 through its drain. The first output signal OUT1 may be outputted from the drain of the first PMOS transistor P1 and the drain of the first NMOS transistor N1.

The second buffer 120 may include a second PMOS transistor P2 and a second NMOS transistor N2. The second PMOS transistor P2 may receive the first output signal OUT1 through its gate, and the second power voltage VCCI through its source. The second NMOS transistor N2 may receive the first output signal OUT1 through its gate, may be electrically coupled to the second ground voltage VSS through its source, and may be electrically coupled to a drain of the second PMOS transistor P2 through its drain. The second output signal OUT2 may be outputted from the drain of the second PMOS transistor P2 and the drain of the second NMOS transistor N2.

The duty cycle circuit 200 may change the level of the first output signal OUT1 according to the levels of the first power voltage VCCQ and the second power voltage VCCI. The duty cycle circuit 200 may make the second output signal OUT2 have a constant duty by changing the level of the first output signal OUT1.

FIG. 2 is a timing diagram illustrating representations of examples of waveforms of the first and second output signals OUT1 and OUT2 according to level differences between the first and second power voltages VCCQ and VCCI. The horizontal axis of FIG. 2 may represent time t. Referring to FIG. 2, when the voltage level of the first power voltage VCCQ is higher than the voltage level of the second power voltage VCCI, turn-on time of the second NMOS transistor N2 of the second buffer 120 may be longer than turn-on time of the second PMOS transistor P2. Therefore, a high segment of the second output signal OUT2 may be shorter than a low segment of the second output signal OUT2, and thus duty of the second output signal OUT2 may decrease. On the other hand, when the voltage level of the first power voltage VCCQ is lower than the voltage level of the second power voltage VCCI, turn-on time of the second NMOS transistor N2 of the second buffer 120 may be shorter than turn-on time of the second PMOS transistor P2. Therefore, the high segment of the second output signal OUT2 may be longer than the low segment of the second output signal OUT2, and thus duty of the second output signal OUT2 may increase. The duty cycle circuit 200 may compensate for the change of the duty of the second output signal OUT2 according to the level differences between the first power voltage VCCQ and the second power voltage VCCI.

When the voltage level of the first power voltage VCCQ is higher than the voltage level of the second power voltage VCCI, the duty cycle circuit 200 may compensate for the duty decrease of the second output signal OUT2. In order to compensate for the duty decrease of the second output signal OUT2, the duty cycle circuit 200 may pull-up drive the first output signal OUT1. When the voltage level of the first power voltage VCCQ is lower than the voltage level of the second power voltage VCCI, the duty cycle circuit 200 may compensate for the duty increase of the second output signal OUT2. In order to compensate for the duty increase of the second output signal OUT2, the duty cycle circuit 200 may pull-down drive the first output signal OUT1.

Referring to FIG. 1, the duty cycle circuit 200 may include a duty control circuit 210 and a duty cycle adjustment circuit 220. The duty control circuit 210 may generate a duty control signal by comparing the voltage levels between the first power voltage VCCQ and the second power voltage VCCI. The duty control signal may include a duty up signal DTU and a duty down signal DTD. The duty up signal DTU may be a signal for compensating for the duty decrease of the second output signal OUT2. The duty down signal DTD may be a signal for compensating for the duty increase of the second output signal OUT2. When the voltage level of the first power voltage VCCQ is lower than the voltage level of the second power voltage VCCI, the duty control circuit 210 may enable the duty down signal DTD. When the voltage level of the first power voltage VCCQ is higher than the voltage level of the second power voltage VCCI, the duty control circuit 210 may enable the duty up signal DTU. When the voltage level of the first power voltage VCCQ is substantially the same as the voltage level of the second power voltage VCCI, the duty control circuit 210 may disable both of the duty up signal DTU and the duty down signal DTD.

The duty control circuit 210 may include a power voltage detection circuit 211 and a duty control signal generation circuit 212. The power voltage detection circuit 211 may generate an over-detection signal OVER and an under-detection signal UNDER by comparing the voltage levels between the first power voltage VCCQ and the second power voltage VCCI. When the voltage level of the first power voltage VCCQ is higher than the voltage level of the second power voltage VCCI, the power voltage detection circuit 211 may enable the over-detection signal OVER. When the voltage level of the first power voltage VCCQ is lower than the voltage level of the second power voltage VCCI, the power voltage detection circuit 211 may enable the under-detection signal UNDER. When the voltage level of the first power voltage VCCQ is substantially the same as the voltage level of the second power voltage VCCI, the power voltage detection circuit 211 may disable both of the over-detection signal OVER and the under-detection signal UNDER. The power voltage detection circuit 211 may generate the over-detection signal OVER and the under-detection signal UNDER by further receiving a voltage division signal VHLS. As described below, the voltage division signal VHLS may be a signal for setting a reference for comparing of the voltage levels between the first power voltage VCCQ and the second power voltage VCCI.

The duty control signal generation circuit 212 may generate the duty up signal DTU and the duty down signal DTD based on the over-detection signal OVER and the under-detection signal UNDER. The duty control signal generation circuit 212 may enable each of the duty up signal DTU and the duty down signal DTD according to each enablement of the over-detection signal OVER and the under-detection signal UNDER. The duty control signal generation circuit 212 may enable the duty up signal DTU when the over-detection signal OVER is enabled. The duty control signal generation circuit 212 may enable the duty down signal DTD when the under-detection signal UNDER is enabled. The duty control signal generation circuit 212 may disable both of the duty up signal DTU and the duty down signal DTD when both of the over-detection signal OVER and the under-detection signal UNDER are disabled.

The duty cycle adjustment circuit 220 may change the voltage level of the first output signal OUT1 based on the duty control signal. The duty cycle adjustment circuit 220 may pull-down drive the first output signal OUT1 when the duty up signal DTU is enabled. The duty cycle adjustment circuit 220 may pull-up drive the first output signal OUT1 when the duty down signal DTD is enabled. The duty cycle adjustment circuit 220 may include a pull-up driving circuit 221 and a pull-down driving circuit 222. The pull-up driving circuit 221 may pull-up drive the first output signal OUT1 based on the duty down signal DTD and the input signal IN. The pull-up driving circuit 221 may pull-up drive the first output signal OUT1 to the voltage level of the first power voltage VCCQ. For example, when the voltage level of the input signal IN is low and the duty down signal DTD is enabled, the pull-up driving circuit 221 may pull-up drive the first output signal OUT1 to the voltage level of the first power voltage VCCQ. The pull-down driving circuit 222 may pull-down drive the first output signal OUT1 based on the duty up signal DTU and the input signal IN. The pull-down driving circuit 222 may pull-down drive the first output signal OUT1 to the voltage level of the first ground voltage VSSQ or the second ground voltage VSS. For example, when the voltage level of the input signal IN is high and the duty up signal DTU is enabled, the pull-down driving circuit 222 may pull-down drive the first output signal OUT1 to the voltage level of the first ground voltage VSSQ or the second ground voltage VSS.

The pull-up driving circuit 221 may include a third PMOS transistor P3 and a fourth PMOS transistor P4. The third PMOS transistor P3 may receive the duty down signal DTD through its gate, and may be electrically coupled to the first power voltage VCCQ through its source. The fourth PMOS transistor P4 may receive the input signal IN through its gate, may be electrically coupled to a drain of the third PMOS transistor P3 through its source, and may be electrically coupled to an output node of the first output signal OUT1 through its drain. The pull-down driving circuit 222 may include a third NMOS transistor N3 and a fourth NMOS transistor N4. The third NMOS transistor N3 may receive the duty up signal DTU through its gate, and may be electrically coupled to the first ground voltage VSSQ or the second ground voltage VSS through its source. The fourth NMOS transistor N4 may receive the input signal IN through its gate, may be electrically coupled to a drain of the third NMOS transistor N3 through its source, and may be electrically coupled to the output node of the first output signal OUT1 through its drain.

FIG. 3 is a block diagram illustrating a representation of an example of the power voltage detection circuit 211 described with reference to FIG. 1. Referring to FIG. 3, the power voltage detection circuit 211 may include a comparison voltage generation circuit 310, a reference voltage generation circuit 320, a first comparison circuit 330, and a second comparison circuit 340. The comparison voltage generation circuit 310 may generate a comparison voltage HVCCQ by receiving the first power voltage VCCQ. The comparison voltage generation circuit 310 may generate the comparison voltage HVCCQ by dividing the voltage of the first power voltage VCCQ. The comparison voltage HVCCQ may have a half of the voltage level of the first power voltage VCCQ.

The reference voltage generation circuit 320 may receive the second power voltage VCCI and the voltage division signal VHLS. The reference voltage generation circuit 320 may generate a first reference voltage VH and a second reference voltage VL from the second power voltage VCCI on the basis of the voltage division signal VHLS. The first reference voltage VH may have a higher voltage level than the second reference voltage VL. For example, the first reference voltage VH may have a slightly higher voltage level than a half of the voltage level of the second power voltage VCCI, and the second reference voltage VL may have a slightly lower voltage level than the half of the voltage level of the second power voltage VCCI. The voltage levels of the first reference voltage VH and the second reference voltage VL may be determined by the voltage division signal VHLS.

The first comparison circuit 330 may generate the over-detection signal OVER by comparing the voltage levels between the comparison voltage HVCCQ and the first reference voltage VH. The first comparison circuit 330 may enable the over-detection signal OVER when the comparison voltage HVCCQ has a higher voltage level than the first reference voltage VH, and may disable the over-detection signal OVER when the comparison voltage HVCCQ has a lower voltage level than the first reference voltage VH.

The second comparison circuit 340 may generate the under-detection signal UNDER by comparing the voltage levels between the comparison voltage HVCCQ and the second reference voltage VL. The second comparison circuit 340 may enable the under-detection signal UNDER when the comparison voltage HVCCQ has a lower voltage level than the second reference voltage VL, and may disable the under-detection signal UNDER when the comparison voltage HVCCQ has a higher voltage level than the second reference voltage VL. Therefore, the power voltage detection circuit 211 may enable the over-detection signal OVER when the first power voltage VCCQ has a higher voltage level than the second power voltage VCCI, and enable the under-detection signal UNDER when the first power voltage VCCQ has a lower voltage level than the second power voltage VCCI. Also, the power voltage detection circuit 211 may disable both of the over-detection signal OVER and the under-detection signal UNDER when the comparison voltage HVCCQ has a voltage level between the voltage levels of the first reference voltage VH and the second reference voltage VL, that is, when the first power voltage VCCQ has substantially the same voltage level as the second power voltage VCCI.

An enable signal EN may be commonly provided to the comparison voltage generation circuit 310, the reference voltage generation circuit 320, the first comparison circuit 330, and the second comparison circuit 340. The enable signal EN may activate the power voltage detection circuit 211. The first and second comparison circuits 330 and 340 may further receive a clock signal CLK. The first and second comparison circuits 330 and 340 may output of results of the comparison between the comparison voltage HVCCQ and the first and second reference voltages VH and VL during a high segment of the clock signal CLK.

Figure 4:
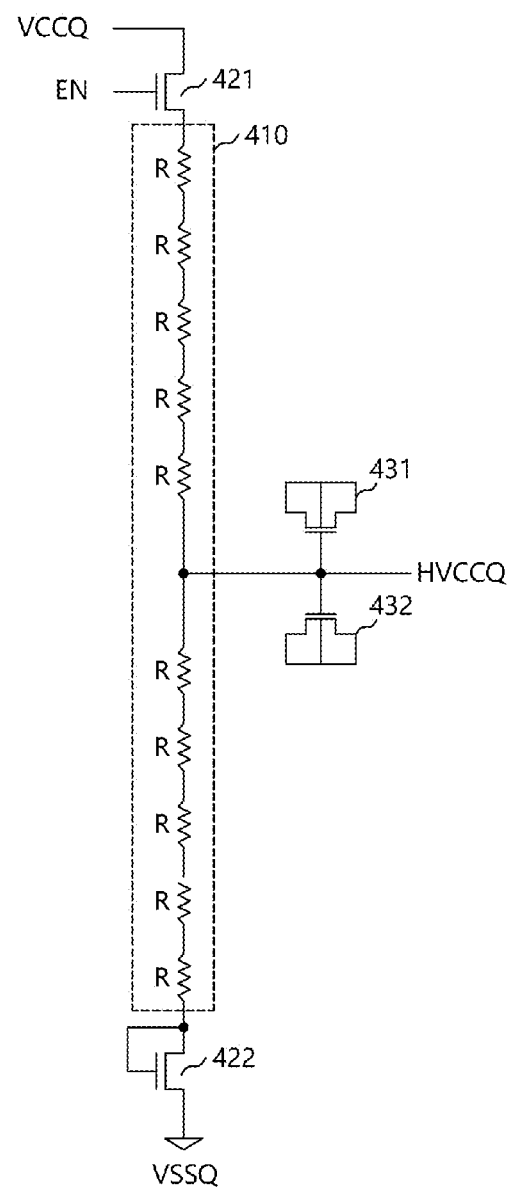
FIG. 4 is a circuit diagram illustrating a representation of an example of a comparison voltage generation circuit illustrated in FIG. 3.

FIG. 4 is a circuit diagram illustrating a representation of an example of the comparison voltage generation circuit 310 described with reference to FIG. 3. Referring to FIG. 4, the comparison voltage generation circuit 310 may include a voltage division circuit 410. The voltage division circuit 410 may include a plurality of resistors R, which are coupled to each other in series and coupled between the first power voltage VCCQ and the first ground voltage VSSQ. Each of the plurality of resistors R may have the same value as one another. For example, when a number of the plurality of resistors is 10, the comparison voltage HVCCQ may be outputted from a node coupling fifth and sixth resistors with reference to a node of the first power voltage VCCQ. The comparison voltage HVCCQ may have a half of the voltage level of the first power voltage VCCQ.

The comparison voltage generation circuit 310 may further include a first transistor 421 and a second transistor 422, and a first capacitor 431 and a second capacitor 432. The first transistor 421 may receive the enable signal EN through its gate, may receive the first power voltage VCCQ through its drain, and may be electrically coupled to a first one of the plurality of resistors R with reference to the node of the first power voltage VCCQ. Gate and drain of the second transistor 422 may be electrically coupled to each other, and its source may be electrically coupled to the first ground voltage VSSQ. When the first transistor 421 is turned on by the enable signal EN, the comparison voltage generation circuit 310 may generate the comparison voltage HVCCQ from the first power voltage VCCQ. Each of the first and second capacitors 431 and 432 may be electrically coupled to an output node of the comparison voltage HVCCQ. The first and second capacitors 431 and 432 may stabilize the voltage level of the comparison voltage HVCCQ.

Figure 5:
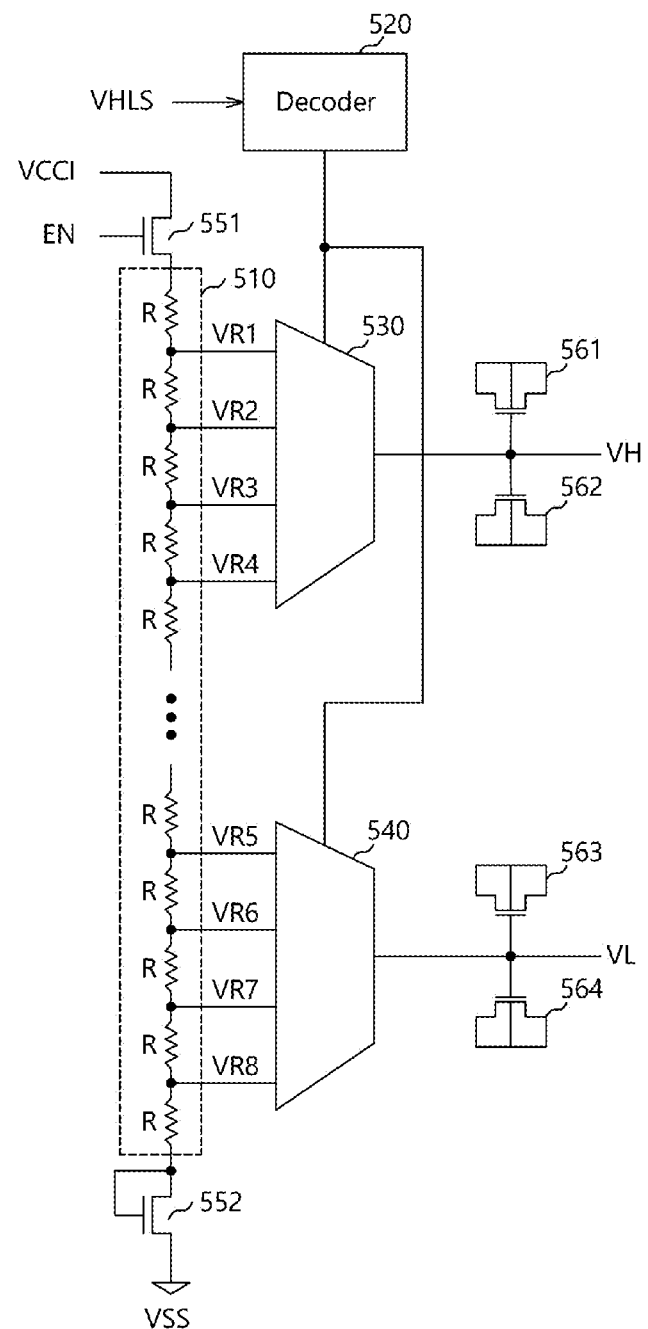
FIG. 5 is a circuit diagram illustrating a representation of an example of a reference voltage generation circuit illustrated in FIG. 3.

FIG. 5 is a circuit diagram illustrating a representation of an example of the reference voltage generation circuit 320 described with reference to FIG. 3. Referring to FIG. 5, the reference voltage generation circuit 320 may include a voltage division circuit 510, a decoder 520, a first multiplexer 530, and a second multiplexer 540. The voltage division circuit 510 may include a plurality of resistors R, which are coupled to each other in series and coupled between the second power voltage VCCI and the second ground voltage VSS. Each of the plurality of resistors R may have the same values as one another. A number of the plurality of resistors R included in the voltage division circuit 510 of the reference voltage generation circuit 320 may be the same as the number of the plurality of resistors R included in the voltage division circuit 410 of the comparison voltage generation circuit 310, which will not limit the scope of the present disclosure. A number of the plurality of resistors R included in the voltage division circuit 510 of the reference voltage generation circuit 320 may be different from the number of the plurality of resistors R included in the voltage division circuit 310 of the comparison voltage generation circuit 310, which will not limit the scope of the present disclosure. FIG. 5 illustrates 10 resistors R included in the voltage division circuit 510, but more or less resistors R may be included therein. The decoder 520 may decode the voltage division signal VHLS.

The first multiplexer 530 may receive first to fourth division voltage VR1, VR2, VR3, and VR4. The first division voltage VR1 may be outputted from a node coupling first and second resistors with reference to a node of the second power voltage VCCI. The second division voltage VR2 may be outputted from a node coupling second and third resistors with reference to the node of the second power voltage VCCI. The third division voltage VR3 may be outputted from a node coupling third and fourth resistors with reference to the node of the second power voltage VCCI. The fourth division voltage VR4 may be outputted from a node coupling fourth and fifth resistors with reference to the node of the second power voltage VCCI. The first multiplexer 530 may output one of the first to fourth division voltages VR1, VR2, VR3, and VR4 as the first reference voltage VH based on an output signal of the decoder 520.

The second multiplexer 540 may receive fifth to eighth division voltage VR5, VR6, VR7, and VR8. The fifth division voltage VR5 may be outputted from a node coupling sixth and seventh resistors with reference to the node of the second power voltage VCCI. The sixth division voltage VR6 may be outputted from a node coupling seventh and eighth resistors with reference to the node of the second power voltage VCCI. The seventh division voltage VR7 may be outputted from a node coupling eighth and ninth resistors with reference to the node of the second power voltage VCCI. The eighth division voltage VR8 may be outputted from a node coupling ninth and tenth resistors with reference to the node of the second power voltage VCCI. The second multiplexer 540 may output one of the fifth to eighth division voltages VR5, VR6, VR7, and VR8 as the second reference voltage VL based on the output signal of the decoder 520. The voltage division signal VHLS may be a 2-bit signal, and the output signal of the decoder 520 may be a 4-bit signal. However, the number of bits included in the voltage division signal VHLS and a decoding scheme of the decoder 520 may be variable according to a number of the division voltages selectively outputted from the first and second multiplexer 530 and 540.

The reference voltage generation circuit 320 may further include a third transistor 551 and a fourth transistor 552, and third to sixth capacitors 561, 562, 563, and 564. The third transistor 551 may receive the enable signal EN through its gate, may receive the second power voltage VCCI through its drain, and may be electrically coupled to a first one of the plurality of resistors R with reference to the node of the second power voltage VCCI. Gate and drain of the fourth transistor 552 may be electrically coupled to each other, and its source may be electrically coupled to the second ground voltage VSS. When the third transistor 551 is turned on by the enable signal EN, the reference voltage generation circuit 320 may generate the first reference voltage VH and the second reference voltage VL from the second power voltage VCCI. Each of the third and fourth capacitors 561 and 562 may be electrically coupled to an output node of the first reference voltage VH. Each of the fifth and sixth capacitors 563 and 564 may be electrically coupled to an output node of the second reference voltage VL. The third and fourth capacitors 561 and 562 may stabilize the voltage level of the first reference voltage VH. The fifth and sixth capacitors 563 and 564 may stabilize the voltage level of the second reference voltage VL.

FIG. 6 is a circuit diagram illustrating a representation of an example of the duty control signal generation circuit 212 described with reference to FIG. 1. Referring to FIG. 6, the duty control signal generation circuit 212 may include a first inverter 611, a first NOR gate 612, a first NAND gate 613, first and second pass gates 621 and 622, first and second latches 631 and 632, third and fourth pass gates 641 and 642, and first and second control latches 650 and 660. The first inverter 611 may invert the over-detection signal OVER. The first NOR gate 612 may receive an output of the first inverter 611 and the under-detection signal UNDER. Therefore, the NOR gate 612 may output a signal having a high level when the over-detection signal OVER is enabled and the under-detection signal UNDER is disabled. The first NAND gate 613 may receive the output of the first inverter 611 and the under-detection signal UNDER. Therefore, the first NAND gate 613 may output a signal having a low level when the over-detection signal OVER is disabled and the under-detection signal UNDER is enabled.

The first pass gate 621 may be turned on by the enable signal EN. The first pass gate 621 may transfer an output of the first NOR gate 612 when the enable signal EN is enabled to a high level. The second pass gate 622 may be turned on by the enable signal EN. The second pass gate 622 may transfer an output of the first NAND gate 613 when the enable signal EN is enabled to a high level. The first and second pass gates 621 and 622 may also receive inverted enable signals ENB.

The first latch 631 may invert and latch an output of the first pass gate 621, and the second latch 632 may invert and latch an output of the second pass gate 622.

The third pass gate 641 may be turned on by the enable signal EN. The third pass gate 641 may transfer an output of the first latch 631 when the enable signal EN is disabled to a low level. The fourth pass gate 642 may be turned on by the enable signal EN. The fourth pass gate 642 may transfer an output of the second latch 632 when the enable signal EN is disabled to a low level. The first and second control latches 650 and 660 may invert and latch outputs of the third and fourth pass gates 641 and 642, respectively. The third and fourth pass gates 641 and 642 may also receive inverted enable signals ENB.

The first and second control latches 650 and 660 may respectively perform latch operations in response to a duty adjustment enable signal DCC. The first control latch 650 may include a second inverter 651 and a second NOR gate 652. The second NOR gate 652 may receive an inverted signal DCCB of the duty adjustment enable signal DCC and an output of the third pass gate 641. Therefore, the first control latch 650 may latch an output of the third pass gate 641 and output the duty up signal DTU when the duty adjustment enable signal DCC is enabled to a high level. The second control latch 660 may include a third inverter 661 and a second NAND gate 662. The second NAND gate 662 may receive the duty adjustment enable signal DCC and an output of the fourth pass gate 642. Therefore, the second control latch 660 may latch an output of the fourth pass gate 642 and output the duty down signal DTD when the duty adjustment enable signal DCC is enabled to a high level. The duty control signal generation circuit 212 may latch a result of an arithmetic operation to the over-detection signal OVER and the under-detection signal UNDER when the enable signal EN is enabled.

When the enable signal EN is disabled, the duty control signal generation circuit 212 may provide the result of the arithmetic operation as the duty up signal DTU and the duty down signal DTD and may block the result of the arithmetic operation to the over-detection signal OVER and the under-detection signal UNDER, which are newly inputted, using the first and second pass gates 621 and 622. When the duty adjustment enable signal DCC is disabled, the duty control signal generation circuit 212 may turn off the first and second control latches 650 and 660 and thus may prevent the generation of the duty up signal DTU and the duty down signal DTD.

The duty control signal generation circuit 212 may further include first and second initialization setting portions 670 and 680. The first initialization setting circuit 670 may set an initial level of the duty up signal DTU. The second initialization setting circuit 680 may set an initial level of the duty down signal DTD. The first and second initialization setting portions 670 and 680 may disable the duty up signal DTU and the duty down signal DTD in response to a reset signal RST, respectively. Therefore, the first and second initialization setting circuit 670 and 680 may disable the duty up signal DTU and the duty down signal DTD in order to prevent the voltage level change of the first output signal OUT1 when the duty cycle circuit 200 does not perform operations.

The first initialization setting circuit 670 may include a first transistor 671. The first transistor 671 may be a NMOS transistor. The first transistor 671 may receive the reset signal RST through its gate, may be electrically coupled to a ground voltage through its source, and may be electrically coupled to an output node of the duty up signal DTU through its drain. The ground voltage may be one of the first ground voltage VSSQ and the second ground voltage VSS. The second initialization setting circuit 680 may include a second transistor 681. The second transistor 681 may be a PMOS transistor. The second transistor 681 may receive an inverted signal of the reset signal RST through its gate, may be electrically coupled to a power voltage through its source, and may be electrically coupled to an output node of the duty down signal DTD through its drain. The power voltage may be one of the first power voltage VCCQ and the second power voltage VCCI. The reset signal RST may be a pulse signal generated at an initial stage of the operation of the semiconductor apparatus 1.

FIG. 7 is a table illustrating a representation of an example of the over-detection signal OVER, the under-detection signal UNDER, the duty up signal DTU, and the duty down signal DTD generated according to the voltage level of the first power voltage VCCQ and the second power voltage VCCI. Hereinafter, the operation of the semiconductor apparatus 1 in accordance with an embodiment of the present disclosure will be described with reference to FIGS. 1 to 7. When the first power voltage VCCQ has the same voltage level as the second power voltage VCCI (VCCQ~VCCI), the comparison voltage HVCCQ may have the voltage level between the first reference voltage VH and the second reference voltage VL. Therefore, the power voltage detection circuit 211 may disable both of the over-detection signal OVER and the under-detection signal UNDER. The duty control signal generation circuit 212 may disable both of the duty up signal DTU and the duty down signal DTD in response to the disabled the over-detection signal OVER and the disabled under-detection signal UNDER. Therefore, the pull-up driving circuit 221 and the pull-down driving circuit 222 of the duty cycle adjustment circuit 220 may be turned off, and the duty cycle adjustment circuit 220 may not perform the compensation operation. Therefore, the voltage level of the first output signal OUT1 may not change, and the second buffer 120 may generate the second output signal OUT2 by amplifying the first output signal OUT1.

When the first power voltage VCCQ has a lower voltage level than the second power voltage VCCI (VCCQ<VCCI), the comparison voltage HVCCQ may have a lower voltage level than the second reference voltage VL. The power voltage detection circuit 211 may enable the under-detection signal UNDER and disable the over-detection signal OVER. The duty control signal generation circuit 212 may enable the duty down signal DTD to a low level, and disable the duty up signal DTU in response to the enabled under-detection signal UNDER and the disabled over-detection signal OVER. The pull-up driving circuit 221 of the duty cycle adjustment circuit 220 may pull-up drive the first output signal OUT1 to the voltage level of the first power voltage VCCQ in response to the enabled duty down signal DTD when the input signal IN has a low voltage level. Therefore, the first output signal OUT1 may have a long high segment, and the turn-on time of the second NMOS transistor N2 of the second buffer 120 may increase. Therefore, the duty cycle adjustment circuit 220 may compensate for the duty increase of the second output signal OUT2.

When the first power voltage VCCQ has a higher voltage level than the second power voltage VCCI (VCCQ>VCCI), the comparison voltage HVCCQ may have a higher voltage level than the first reference voltage VH. The power voltage detection circuit 211 may enable the over-detection signal OVER and disable the under-detection signal UNDER. The duty control signal generation circuit 212 may enable the duty up signal DTU, and disable the duty down signal DTD in response to the enabled over-detection signal OVER and the disabled under-detection signal UNDER. The pull-down driving circuit 222 of the duty cycle adjustment circuit 220 may pull-down drive the first output signal OUT1 to the voltage level of the first ground voltage VSSQ and the second ground voltage VSS in response to the enabled duty up signal DTU when the input signal IN has a high voltage level. Therefore, the first output signal OUT1 may have a long low segment, and the turn-on time of the second PMOS transistor P2 of the second buffer 120 may increase. Therefore, the duty cycle adjustment circuit 220 may compensate for the duty decrease of the second output signal OUT2.

The semiconductor apparatus 1 in accordance with an embodiment of the present disclosure may be implemented in entire master apparatus and slave apparatus using two or more external power voltages. The master apparatus may a semiconductor apparatus running an operation system and performing various arithmetic operations in an electronic device. For example, the master apparatus may include a processor. The processor may include a central processing unit (CPU), a graphic processing unit (GPU), a multi-media processor (MMP), and a digital signal processor (DSP). Also, the processor may be implemented in the form of the system on chip (SoC) through combination of multi-function processor chips such as an application processor (AP).

The slave apparatus may be operable under the control of the master apparatus. The slave apparatus may include various elements operable under the control of the master apparatus. For example, the slave apparatus may include modules performing various functions of a system memory, a power controller, a communication module, a multimedia module, and an input/output module. The slave apparatus may be a memory, and the memory may include a volatile memory and a non-volatile memory. The volatile memory may include a static RAM (SRAM), a dynamic RAM (DRAM), and a synchronous DARM (SDRAM). The non-volatile memory may include a Read Only Memory (ROM), a programmable ROM (PROM), an electrically erase and programmable ROM (EEPROM), an electrically erasable and programmable ROM (EPROM), a flash memory, a phase change RAM (PRAM), a magnetic RAM (MRAM), a resistive RAM (RRAM), and a ferroelectric RAM (FRAM).

Figure 8:
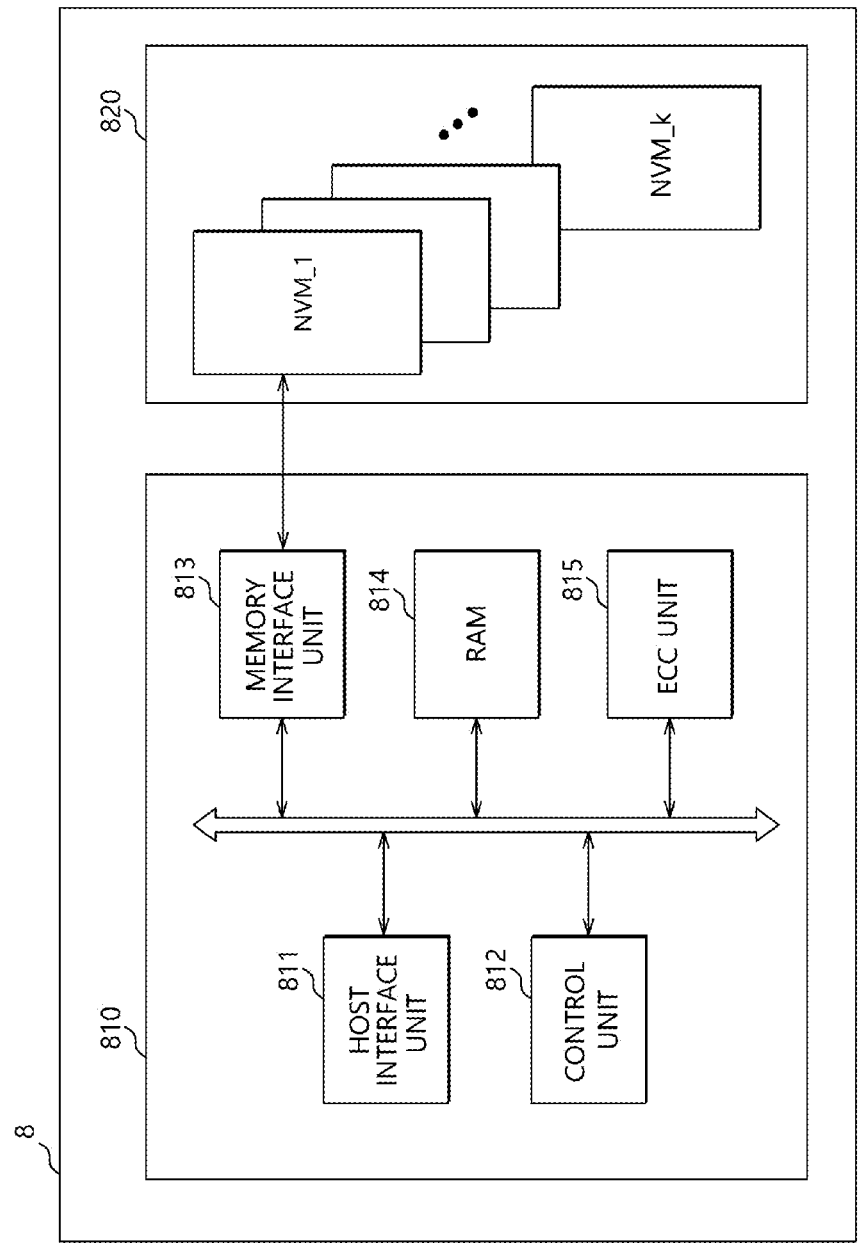
FIG. 8 is a block diagram illustrating a representation of an example of a data storage system in accordance with an embodiment of the present disclosure.

FIG. 8 is a block diagram illustrating a representation of an example of a data storage system 8 in accordance with an embodiment of the present disclosure. Referring to FIG. 8, the data storage system 8 may include a controller 810 and a non-volatile memory apparatus 820. The data storage system 8 may be coupled to a host device such as mobile phones, MP3 players, lap-top computers, desktop computers, game machines, TVs, and an in-vehicle infotainment systems.

The controller 810 may access the non-volatile memory apparatus 820 in response to the request from the host device. For example, the controller 810 may control read, program and erase operations of the non-volatile memory apparatus 820. The controller 810 may drive firmware or software for the control of the non-volatile memory apparatus 820.

The controller 810 may include a host interface unit 811, a control unit 812, a memory interface unit 813, a RAM 814, and an ECC unit 815.

The control unit 812 may control overall operations of the controller 810 in response to a request from the host device.

The RAM 814 may serve as an operation memory of the control unit 812. The RAM 814 may serve as a buffer memory temporarily storing data read from the non-volatile memory device 820 or data provided from the host device.

The host interface unit 811 may interface the host device with the controller 810. For example, the host interface unit 811 may communicate with the host device through one of various interface protocols such as a UFS (Universal Flash Storage) protocol, a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial Advanced Technology Attachment) protocol, an SCSI (Small Computer System Interface) protocol, and SAS (Serial Attached SCSI) protocol.

The memory interface unit 813 may interface the controller 810 with the non-volatile memory device 820. The memory interface unit 813 may provide a command and address to the non-volatile memory device 820. Furthermore, the memory interface unit 813 may exchange data with the non-volatile memory device 820.

The ECC unit 815 may detect errors of the data read from the non-volatile memory device 820. Furthermore, the ECC unit 815 may correct the detected errors, when the number of detected errors falls within a correction range.

The non-volatile memory device 820 may serve as a storage medium of the data storage system 8. The non-volatile memory device 820 may include a plurality of non-volatile memory chips or dies (NVM_1 to NVM_k).

The controller 810 and the non-volatile memory device 820 may be integrated into one of various types of data storage devices. For example, the controller 810 and the non-volatile memory device 820 may be integrated into a single semiconductor device to form one of a multi-media card in types of MMC, eMMC, RS-MMC, or micro-MMC, an SD (secure digital) card in types of SD, Mini-SD, or Micro-SD, a USB storage device, a UFS (universal flash storage) device, a PCMCIA (personal computer memory card international association) card, a CF (compact flash) card, a smart media card, and a memory stick. The controller 810 and the non-volatile memory apparatus 820 may perform operations by receiving two or more external power voltages, and the semiconductor apparatus 1 in accordance with an embodiment of the present disclosure may be implemented to each of the controller 810 and the non-volatile memory apparatus 820.

While certain embodiments have been described above, it will be understood to those skilled in the art that the embodiments described are by way of example only. Accordingly, the signal generator adjusting duty cycle and semiconductor apparatus using the same should not be limited based on the described embodiments. Rather, the signal generator adjusting duty cycle and semiconductor apparatus using the same described herein should only be limited in light of the claims that follow when taken in conjunction with the above description and accompanying drawings.

What is claimed is:

1. A signal generator comprising:
a first buffer configured to amplify an input signal to a level of a first power voltage and generate a first output signal;
a second buffer configured to amplify the first output signal to a level of a second power voltage and generate a second output signal;
a duty control circuit configured to generate a duty control signal by comparing the levels of the first power voltage and the second power voltage; and
a duty cycle adjustment circuit configured to change a voltage level of the first output signal based on the input signal and the duty control signal.

2. The signal generator of claim 1, wherein the first buffer generates the first output signal having a voltage level between the first power voltage and a first ground voltage based on the input signal.

3. The signal generator of claim 2, wherein the second buffer generates the second output signal having a voltage level between the second power voltage and a second ground voltage based on the input signal.

4. The signal generator of claim 3, wherein the first ground voltage has substantially the same level as the second ground voltage.

5. The signal generator of claim 1,
wherein the duty control signal includes a duty up signal and a duty down signal, and
wherein the duty control circuit generates the duty up signal when the level of the first power voltage is higher than the level of the second power voltage, and generates the duty down signal when the level of the first power voltage is lower than the level of the second power voltage.

6. The signal generator of claim 1, wherein the duty control circuit comprises:
a power voltage detection circuit configured to generate an over-detection signal and an under-detection signal by comparing the levels of the first power voltage and the second power voltage; and
a duty control signal generation circuit configured to generate the duty up signal and the duty down signal based on the over-detection signal and the under-detection signal.

7. The signal generator of claim 6, wherein the power voltage detection circuit comprises:
a comparison voltage generation circuit configured to generate a comparison voltage by dividing the first power voltage;
a reference voltage generation circuit configured to generate a first reference voltage and a second reference voltage, which has a lower level than the first reference voltage, by dividing the second power voltage on the basis of a voltage division signal;
a first comparison circuit configured to generate the over-detection signal by comparing the levels between the comparison voltage and the first reference voltage; and
a second comparison circuit configured to generate the under-detection signal by comparing the levels between the comparison voltage and the second reference voltage.

8. The signal generator of claim 7, wherein the duty control signal generation circuit enables the duty up signal when the over-detection signal is enabled, and enables the duty down signal when the under-detection signal is enabled.

9. The signal generator of claim 7, wherein the duty control signal generation circuit disables both of the duty up signal and the duty down signal when both of the over-detection signal and the under-detection signal are disabled.

10. The signal generator of claim 1, wherein the duty cycle adjustment circuit comprises:
a pull-up driving circuit configured to pull-up drive the first output signal based on the duty down signal and the input signal; and
a pull-down driving circuit configured to pull-down drive the first output signal based on the duty up signal and the input signal.

11. The signal generator of claim 10, wherein the pull-up driving circuit pull-up drives the first output signal to the level of the first power voltage.

12. A semiconductor apparatus comprising:
a first buffer configured to generate a first output signal having a voltage level between a first power voltage and a first ground voltage to amplify an input signal;
a second buffer configured to generate a second output signal having a voltage level between a second power voltage and a second ground voltage to amplify the first output signal; and
a duty cycle circuit configured to pull-up drive the first output signal when the level of the first power voltage is higher than the level of the second power voltage, and pull-down drive the first output signal when the level of the first power voltage is lower than the level of the second power voltage.

13. The semiconductor apparatus of claim 12, wherein the first ground voltage has substantially the same level as the second ground voltage.

14. The semiconductor apparatus of claim 12, wherein the duty cycle circuit comprises:
a duty control circuit configured to generate a duty up signal and a duty down signal by comparing the levels between the first power voltage and the second power voltage; and
a duty cycle adjustment circuit configured to pull-up drive the first output signal based on the duty down signal and the input signal, and pull-down drive the first output signal based on the duty up signal and the input signal.

15. The semiconductor apparatus of claim 14, wherein the duty control circuit generates the duty up signal when the level of the first power voltage is higher than the level of the second power voltage, and generates the duty down signal when the level of the first power voltage is lower than the level of the second power voltage.

16. The semiconductor apparatus of claim 14, wherein the duty control circuit comprises:
a power voltage detection circuit configured to generate an over-detection signal and an under-detection signal by comparing the levels between the first power voltage and the second power voltage; and
a duty control signal generation circuit configured to generate the duty up signal and the duty down signal based on the over-detection signal and the under-detection signal.

17. The semiconductor apparatus of claim 16, wherein the power voltage detection circuit comprises:
a comparison voltage generation circuit configured to generate a comparison voltage by dividing the first power voltage;
a reference voltage generation circuit configured to generate a first reference voltage and a second reference voltage, which has a lower level than the first reference voltage, by dividing the second power voltage on the basis of a voltage division signal;
a first comparison circuit configured to generate the over-detection signal by comparing the levels between the comparison voltage and the first reference voltage; and
a second comparison circuit configured to generate the under-detection signal by comparing the levels between the comparison voltage and the second reference voltage.

18. The semiconductor apparatus of claim 17, wherein the duty control signal generation circuit enables the duty up signal when the over-detection signal is enabled, and enables the duty down signal when the under-detection signal is enabled.

19. The semiconductor apparatus of claim 17, wherein the duty control signal generation circuit disables both of the duty up signal and the duty down signal when both of the over-detection signal and the under-detection signal are disabled.

20. The semiconductor apparatus of claim 14, wherein the duty cycle adjustment circuit comprises:
a pull-up driving circuit configured to pull-up drive the first output signal based on the duty down signal and the input signal; and
a pull-down driving circuit configured to pull-down drive the first output signal based on the duty up signal and the input signal.

21. A signal generator comprising:
a first buffer configured to amplify an input signal to a level of a first power voltage and generate a first output signal;
a second buffer configured to amplify the first output signal to a level of a second power voltage and generate a second output signal; and
a duty cycle circuit configured to compensate for a change of a duty of the second output signal according to level differences between the first power voltage and the second power voltage.

22. The signal generator of claim 21, wherein to compensate for a duty decrease of the second output signal the duty cycle circuit pull-up drives the first output signal.

23. The signal generator of claim 21, wherein when the first power voltage is higher than the second power voltage, the duty of the second output signal is decreased.

24. The signal generator of claim 21, wherein to compensate for a duty increase of the second output signal the duty cycle circuit pull-down drives the first output signal.

25. The signal generator of claim 21, wherein when the first power voltage is lower than the second power voltage, the duty of the second output signal is increased.

26. The signal generator of claim 21, wherein the second buffer comprises:
a first transistor having a gate configured to receive the first output signal, a source configured to receive the second power voltage, and a drain configured to provide the second output signal; and
a second transistor having a gate configured to receive the first output signal, a drain configured to receive a ground voltage, and a source configured to provide the second output signal.

27. The signal generator of claim 26, wherein when the first power voltage is higher than the second power voltage a turn-on time of the second transistor is longer than a turn-on time of the first transistor and high segments of the second output signal are shorter than low segments of the second output signal.

28. The signal generator of claim 26, wherein when the first power voltage is lower than the second power voltage a turn-on time of the second transistor is shorter than a turn-on time of the first transistor and high segments of the second output signal are longer than low segments of the second output signal.

29. The signal generator of claim 26, wherein the duty cycle circuit is configured change a level of the first output signal to provide the second output signal having a constant duty.

* * * * *